United States Patent [19]
Linz et al.

[11] Patent Number: 6,008,648
[45] Date of Patent: Dec. 28, 1999

[54] METHOD FOR PRODUCING PHYSICAL GRADIENT WAVEFORMS IN MAGNETIC RESONANCE IMAGING

[75] Inventors: Anton M. Linz, Mukwonago; Jason A. Polzin, Lake Mills; Paul E. Licato, Wauwatosa; Graeme C. McKinnon, Hartland, all of Wis.

[73] Assignee: General Electric Company, Milwaukee, Wis.

[21] Appl. No.: 08/985,019

[22] Filed: Dec. 4, 1997

[51] Int. Cl.[6] .................................................. G01V 3/00

[52] U.S. Cl. .......................... 324/309; 324/318; 324/307; 600/425

[58] Field of Search ..................................... 324/309, 313, 324/318, 308, 307; 600/425

[56] References Cited

U.S. PATENT DOCUMENTS

| 4,322,684 | 3/1982 | Hounsfield | 324/309 |
|---|---|---|---|
| 4,510,448 | 4/1985 | Riedl | 324/309 |
| 4,743,851 | 5/1988 | Lim et al. | 324/309 |
| 4,952,877 | 8/1990 | Stormont et al. | 324/312 |
| 5,399,969 | 3/1995 | Berstein | 324/309 |

Primary Examiner—Christine Oda
Assistant Examiner—Brij B. Shrivastav
Attorney, Agent, or Firm—Quarles & Brady; Christian G. Cabou; Phyllis Y. Price

[57] ABSTRACT

An MRI system produces magnetic field gradients along physical axes during a patient scan. The gradients are specified as logical gradient waveforms in a pulse sequence and these are stored in a logical vector table. A physical vector table is produced by rotating amplitude values in the logical vector table, and the resulting rotated amplitude values are used to calculate the heating in each gradient axis of the MRI system.

6 Claims, 4 Drawing Sheets

METHOD FOR PRODUCING PHYSICAL GRADIENT WAVEFORMS IN MAGNETIC RESONANCE IMAGING

BACKGROUND OF THE INVENTION

The field of the invention is nuclear magnetic resonance imaging methods and systems. More particularly, the invention relates to the production of gradient fields used in imaging and spectroscopy pulse sequences.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field B,) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described with reference to a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

The imaging gradients are produced by gradient amplifiers that drive coils which produce magnetic fields having gradients directed along physical axes. Typically, three gradient amplifiers with corresponding coils produce gradient fields directed along three orthogonal axes, x, y, and z. These are "physical" axes because they are fixed with respect to the MRI system geometry.

MRI pulse sequences are defined by the gradient fields and the RF fields that are to be produced during each NMR measurement. The gradient fields are defined by gradient waveforms produced along three orthogonal axes. For example, a slice-selecting gradient may be applied along one axis; a phase encoding gradient may be produced along another, orthogonal axis; and a readout gradient may be produced along yet another orthogonal axis. These "logical" axes may correspond to the physical axes on the MRI system for one orientation of the slice or volume to be images (e.g. a transverse plane), but as a general matter they do not. When the MRI pulse sequence is performed on an MRI system, therefore, each logical gradient field may be produced by the combination of one to three of the physical gradient fields, depending on the prescribed orientation of the image to be acquired.

When a pulse sequence is executed during a patient scan the logical gradient waveforms are converted into physical gradient waveforms for driving the gradient amplifiers on the MRI system. This is performed by a matrix rotation of the logical gradient waveforms. As described, for example, in U.S. Pat. No. 4,743,851, the logical gradient is stored as a series of points which represent the amplitude of the gradient at successive time increments (e.g. every 4 microseconds) during the pulse sequence. These points are read out of memory in sequence and multiplied by three rotation factors to rotate the logical gradient into each of the three physical axes. For three logical gradient waveforms, this involves nine multiplications and additions for every time increment of the pulse sequence.

One of the practical limitations of MRI systems is the heat dissipation capacity of gradient amplifiers and coils. Pulse sequences can often be shortened to reduce total scan time by increasing the amplitude of a gradient. Unfortunately, higher amplitude gradients produced at a higher repetition rate also produce more heat. As a result, gradient heating often limits the extent to which a pulse sequence can be shortened.

Prior to the commencement of a scan it is desirable to calculate the amount of gradient heating that will occur to insure that limits are not exceeded. Since the logical gradient waveforms are stored as a series of amplitude points, it is relatively easy to integrate the logical waveforms over the duration of the pulse sequence and determine the amount of heat each will produce. This does not necessarily reveal, however, how much heating will occur in the physical amplifiers and coils because the waveforms may be changed considerably during the rotation into the physical axes. The computations necessary to rotate the logical gradient waveforms and calculate heating in each physical axis is substantial and not usually performed in state-of-the-art MRI systems. As a result, gradient pulse amplitudes are often unnecessarily derated to insure that heating problems do not occur.

SUMMARY OF THE INVENTION

The present invention is an improved method for calculating the physical gradients in an MRI system based on a prescribed set of logical gradient waveforms. More particularly, the method includes: determining break point times in the prescribed gradient waveforms; forming a logical vector table in which the vector elements comprise the amplitudes of the logical gradient waveforms, at each successive break point time; and rotating the vector elements in the logical vector table to form a physical vector table. The physical vector table may be used to calculate heating in the gradient amplifiers and coils so that the prescribed scan can be optimized, and the physical vector table may be interpolated to produce the physical gradient waveforms for driving the gradient amplifiers on the MRI system.

A general object of the invention is to produce physical gradient waveforms from a prescribed set of logical gradient waveforms. By forming a physical vector table based on the amplitudes of the logical gradients at each break point time, the physical vector table can be produced with a few 3D vector rotations. The amount and direction of the rotation is determined by the prescribed orientation of the desired image with respect to the physical gradient axes of the MRI system. The physical vector table can then be used directly to estimate gradient heating and the same physical vector table can be interpolated either off-line, or in real-time to produce the physical gradient signals needed to drive the gradient amplifiers.

DESCRIPTION OF THE PREFERRED EMBODIMENT

Figure 1:
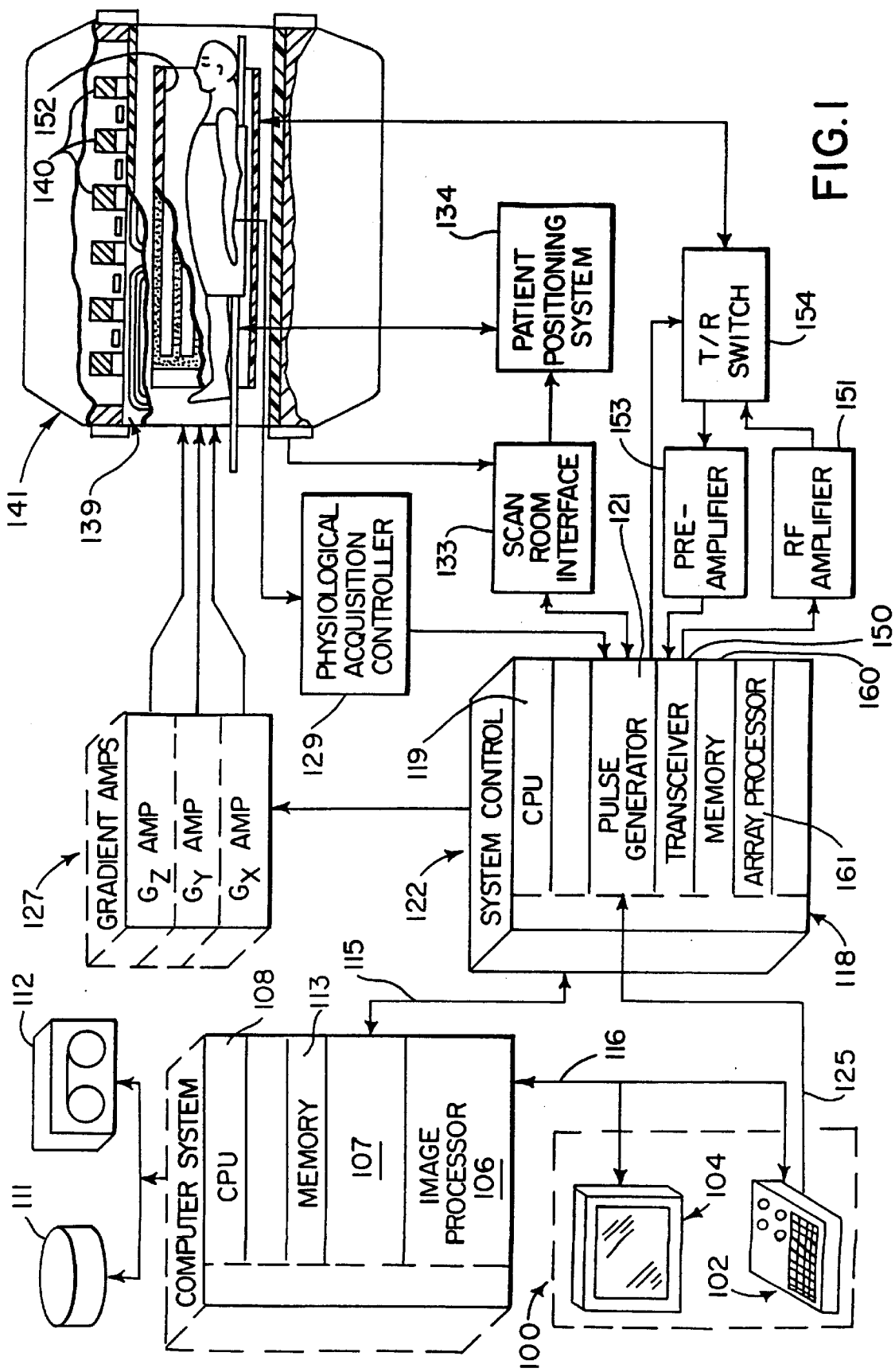
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the physical magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,922,736 which are incorporated herein by reference.

Figure 2:
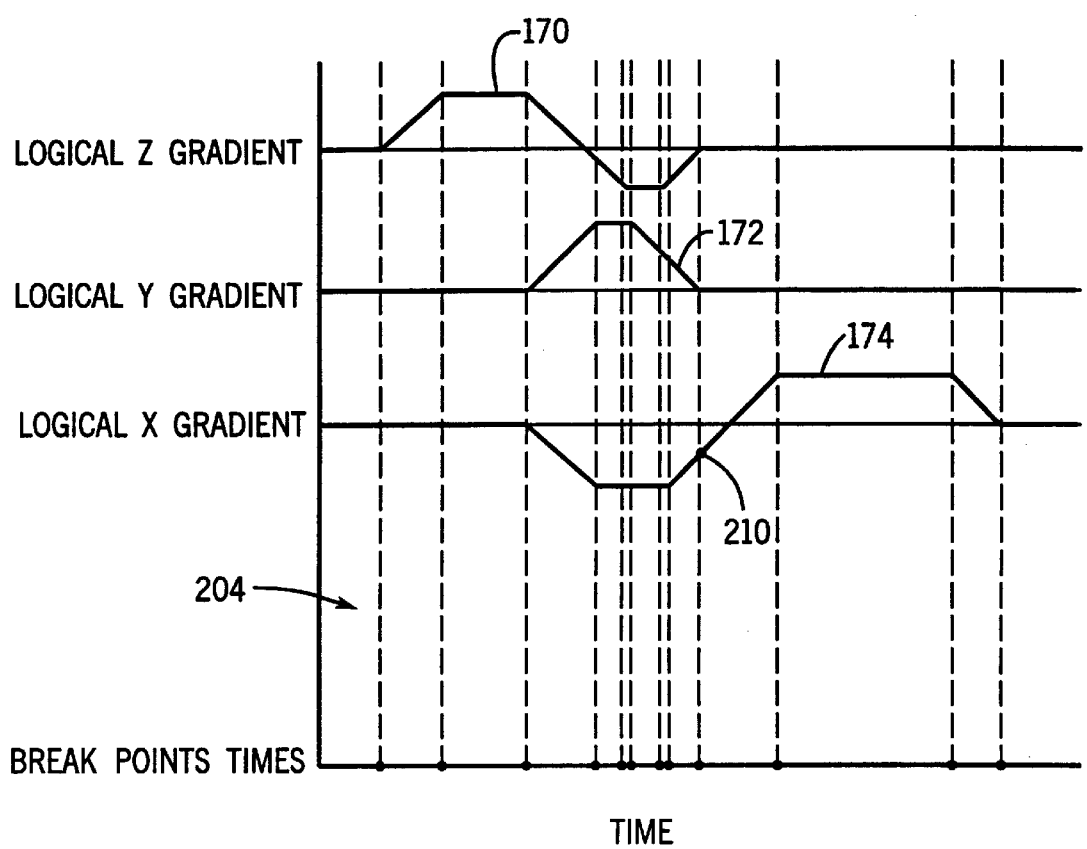
FIG. 2 is a graphic a representation of a set of logical gradient waveforms prescribed for use in an imaging pulse sequence.

Referring particularly to FIG. 2, when a particular pulse sequence is prescribed by the user of the MRI system, a set of logical gradient waveforms are produced. In a 2DFT pulse sequence, for example, a logical z gradient waveform 170 may be specified to produce what is often referred to as a "slice selection gradient". Similarly, a logical y gradient waveform 172 may be specified as a "phase encoding" gradient, and a logical x gradient waveform 174 may be specified as a "readout" gradient. If these logical gradient waveforms are applied directly to their corresponding x, y and z gradient amplifiers 127, an image will be produced that has a set, "reference" orientation with respect to the MRI system.

The present invention deals with the very common situation in which the user has prescribed an image that is oriented at an angle with respect to this reference orientation. As is well known in the art, this requires that the three logical gradient waveforms 170, 172 and 174 be rotated by a corresponding angle. For three gradients, this rotation is performed by a 3 by 3 matrix multiplication as described, for example, in U.S. Pat. No. 4,743,851. Each logical gradient waveform is played out and separately rotated by a matrix multiplier to produce components for each physical gradient axis. As a result of such rotation, the logical z slice selection gradient waveform 170 may be produced by any one or combination of two or three of the physical gradient amplifiers on the MRI system. The same is true of the other logical gradients.

Figure 3:
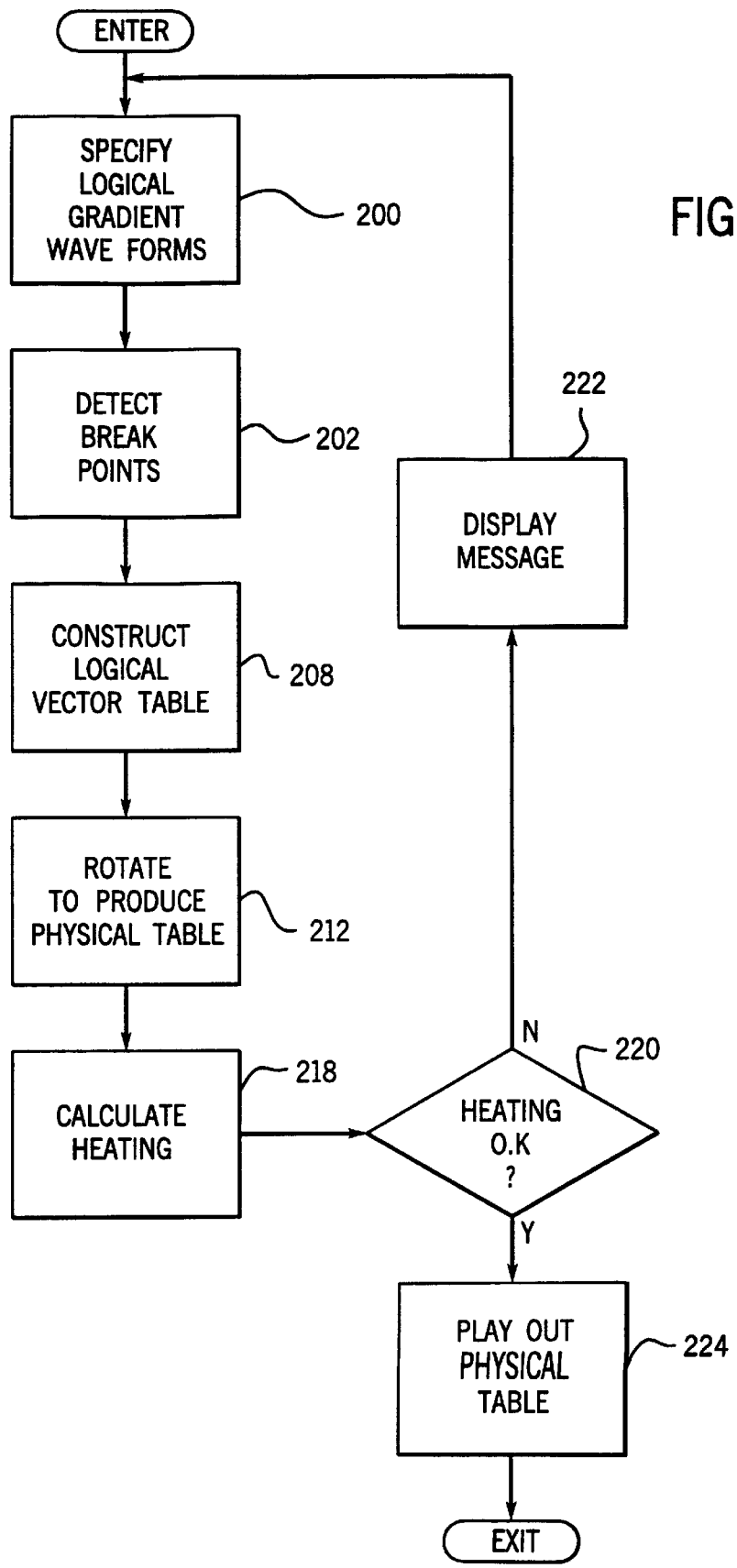
FIG. 3 is a flow chart of the procedures performed by the MRI system of FIG. 1 to practice the preferred embodiment of the invention.

Rather than rotating each logical gradient waveform to the prescribed image orientation, the teaching of the present invention is to combine the three logical gradient waveforms into a three-dimensional vector representation of the logical gradients. Referring particularly to FIG. 3, once a particular set of logical gradient waveforms have been prescribed, as indicated at process block 200, the break points in each waveform are detected as indicated by process block 202. Referring again to FIG. 2, the break points are those times indicated by the vertical dotted lines 204 at which one or more of the logical gradient waveforms 170, 172, or 174 have a break, or discontinuity, in their form. Each waveform is viewed as a series of continuous segments and the break points are where two segments join. The gradient waveforms are prescribed by the amplitude at each break point. In the preferred embodiment only linear segments are shown, however, other shapes such as cubic spline or circular are also possible.

Figure 4:
FIG. 4 is a schematic representation of a logical vector table produced in the procedure of FIG. 3.

After the break points are detected, a logical vector table 206 is constructed as indicated at process block 208. As shown in FIG. 4, this logical vector table 206 is formed by storing the time of each detected break point and the amplitude of each logical gradient waveform at that time. When the time corresponds to a break point in a logical gradient waveform this task is trivial since the amplitude is specified at each break point. However, when the time occurs in the middle portion of a gradient segment (e.g. the point 210 in FIG. 2) the amplitude of the gradient must be interpolated. In the preferred embodiment in which only linear segments are used, linear interpolation between the amplitudes specified at the ends of the intersected segment is performed. For each detected break point, therefore, the time at which the break point occurs and the amplitude of each logical gradient waveform x, y and z is stored in the table 206. Each entry in the table can be viewed as a three-dimensional vector in which its x, y and z components reference a logical coordinate system.

Referring again to FIG. 3, the next step in the process is to rotate the three-dimensional vectors in the logical vector table 206, as indicated by process block 212.

Figure 5:
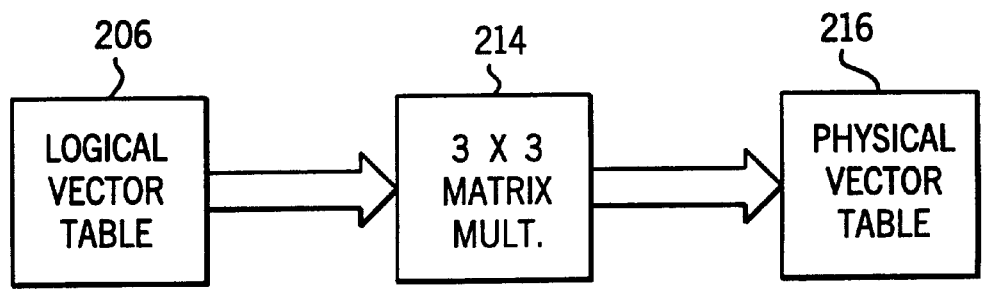
FIG. 5 is a block diagram illustrating the process of producing a physical vector table which forms part of the procedure of FIG. 3.

As shown in FIG. 5, this rotation is accomplished with a 3 by 3 matrix multiplication 214 of each vector in the table 206 to produce a corresponding rotated vector that is stored in a physical vector table 216. If the three-dimensional vector in table 206 at time $t_i$ is represented by $x_i$, $y_i$, $z_i$, the corresponding physical vector $x_i'$, $y_i'$, $z_i'$, in the table 216 is thus produced as follows:

$$\begin{bmatrix} x_i' \\ y_i' \\ z_i' \end{bmatrix} = \begin{bmatrix} a_1 & a_2 & a_3 \\ b_1 & b_2 & b_1 \\ c_1 & c_1 & c_1 \end{bmatrix} \begin{bmatrix} x_i \\ y_i \\ z_i \end{bmatrix}$$

The physical vector table 216 is structured, the same as the logical vector table 206, but the values of the x, y and z components are different to reflect the fact that they reference the physical gradients on the MRI system.

As indicated at process block 218 in FIG. 3, the heating produced by the gradient waveforms may now be accurately calculated. The entries in the physical vector table are the amplitudes at each break point of the gradient waveforms applied to each gradient amplifier on the MRI system. The area under each of these waveforms can be easily calculated using the break point amplitudes and the heating load can be estimated from this figure. If the heating load on one or more of the axes exceeds a preset limit, the system branches at decision block 220, an appropriate message is displayed to the operator at 222, and the system loops back to process block 200 where the gradient waveforms can be re-specified.

When the final gradient waveforms have been specified the contents of the physical vector table 216 may be played out as indicated at process block 224 to control the gradient amplifiers 127 during the scan. This can be accomplished in a number ways. First, the break point amplitudes of each physical axis gradient waveform may be interpolated off-line to produce a set of incremental amplitude values which are stored. These stored amplitude values indicate the gradient amplitude at each time increment (e.g. every 4 microseconds) during the pulse sequence and they are read out of memory in sequence and applied to the gradient amplifiers 127 as the pulse sequence is performed by the pulse generator module 121. A second method is to play out the break point amplitudes from the physical vector table 216 while the pulse sequence is being performed. In this embodiment the interpolation is performed in real-time and is best accomplished by the addition of a 3-axis interpolator to the input of the gradient amplifiers 127. The pulse generator module 121 thus reads the break point amplitude vectors out of the table 216 and the gradient amplifiers 127 perform the interpolation necessary to provide 3 axis, continuous control over the three gradient fields.

It should be apparent to those skilled in the art that the break point amplitude values stored in the physical vector table 216 can also be used for other purposes. Eddy current compensation methods require the shape of the physical gradient waveform and its derivative. These are easily produced from the break point description in the table 216 and may be used to calculate constants for Eddy current compensation circuits used in the gradient amplifiers 127. Similarly, the break point description of the gradient waveforms may be used by adaptive ECG filtering circuits to calculate the necessary constants.

We claim:

1. A method for producing gradient waveforms in an MRI system, the steps comprising:

specifying a logical gradient waveform for each gradient to be used in a pulse sequence;

detecting the break points in all the specified logical gradient waveforms;

producing a logical vector table which stores the amplitude of each specified logical gradient waveform at each detected break point;

producing a physical vector table by rotating the amplitudes stored in the logical vector table at each detected break point and storing physical amplitudes for each break point; and producing physical gradient waveforms for each gradient axis on the MRI system by playing out the physical amplitudes stored in the physical vector table at successive break points.

2. The method as recited in claim 1 which includes:

calculating from the physical amplitudes stored in the physical vector table the heat produced by each gradient axis.

3. The method as recited in claim 2 which includes:

comparing the calculated heat produced by each gradient axis with a preset limit; and producing a message if the calculated heat exceeds the preset limit for any gradient axis.

4. The method as recited in claim 1 in which the physical vector table is produced by performing a matrix multiplication of the amplitudes stored at each break point in the logical vector table.

5. The method as recited in claim 1 in which the physical amplitudes stored in the physical vector table are played out to interpolators which produce substantially continuous gradient waveforms.

6. The method as recited in claim 5 in which the physical amplitudes are played out to the interpolators as the MRI system is performing a pulse sequence in which magnetic field gradients are generated using the gradient waveforms.

* * * * *